United States Patent [19]
Mulkens et al.

[11] Patent Number: 5,508,528
[45] Date of Patent: Apr. 16, 1996

[54] ILLUMINATION UNIT HAVING A FACILITY FOR PREVENTING CONTAMINATION OF OPTICAL COMPONENTS, AND PHOTOLITHOGRAPHIC APPARATUS INCLUDING SUCH AN ILLUMINATION UNIT

[75] Inventors: Johannes C. H. Mulkens; Nicolaas C. J. A. Van Hijningen, both of Eindhoven; Judocus M. D. Stoeldrayer, Hapert, all of Netherlands

[73] Assignee: ASM Lithography B.V., LA Veldhoven, Netherlands

[21] Appl. No.: 346,978

[22] Filed: Nov. 29, 1994

[30] Foreign Application Priority Data

Dec. 3, 1993 [BE] Belgium ............... 09301333

[51] Int. Cl.$^6$ ............... G01J 1/00; A61N 5/00; G21G 5/00
[52] U.S. Cl. ............... 250/492.1; 250/504 R
[58] Field of Search ............... 250/492.2, 492.1, 250/493.1, 503.1, 504 R

[56] References Cited

U.S. PATENT DOCUMENTS

| | | | |
|---|---|---|---|
| 3,949,258 | 4/1976 | Soodak | 313/25 |
| 4,485,123 | 11/1984 | Troue | 427/54.1 |
| 5,079,187 | 1/1992 | Asmus et al. | 437/173 |
| 5,100,237 | 3/1992 | Wittekoek et al. | 356/401 |
| 5,144,363 | 9/1992 | Wittekoek et al. | 355/53 |
| 5,166,530 | 11/1992 | McCleary | 250/493.1 |
| 5,191,200 | 3/1993 | Van Der Werf et al. | 250/201.4 |
| 5,377,708 | 1/1995 | Bergman et al. | 134/105 |
| 5,387,800 | 2/1995 | Kurtich et al. | 250/493.1 |

FOREIGN PATENT DOCUMENTS

| | | | |
|---|---|---|---|
| 0467455 | 1/1992 | European Pat. Off. | H04N 9/64 |
| 0498499 | 8/1992 | European Pat. Off. | G03F 7/20 |

*Primary Examiner*—Bruce C. Anderson
*Attorney, Agent, or Firm*—Paul R. Miller

[57] ABSTRACT

An imaging apparatus and an illumination unit for use in such an apparatus are described, which unit comprises an illumination housing (LH) accommodating a radiation source (LA) and at least a reflector (RL). To prevent a decrease of the radiation power supplied by the illumination housing, this housing is provided with means (LA, SH, $L_{29}$) which prevent a diffuse deposit of silicon-containing particles present in the ambient air from being formed on optical components within the illumination housing.

6 Claims, 3 Drawing Sheets

ILLUMINATION UNIT HAVING A FACILITY FOR PREVENTING CONTAMINATION OF OPTICAL COMPONENTS, AND PHOTOLITHOGRAPHIC APPARATUS INCLUDING SUCH AN ILLUMINATION UNIT

The invention relates to an illumination unit for use in an ambience in which particles which can be decomposed under the influence of illumination radiation are present and for illuminating an object with a high efficiency with the, said illumination unit comprising an illumination housing which accommodates a radiation source and an optical system for forming an illumination beam from the radiation emitted by the radiation source, a gaseous cooling medium being passed through the illumination housing for cooling the radiation source, with the illumination unit further including means for preventing a deposit formed from the decomposable particles on surface areas present within the illumination housing and in the path of the illumination beam.

The invention also relates to a photolithographic apparatus including such an illumination unit.

BACKGROUND OF THE INVENTION

Such an apparatus including an illumination unit and intended to manufacture integrated semiconductor circuits is known from U.S. Pat. No. 5,166,530. In this apparatus a mask is illuminated and imaged in a repetitive manner on a photoresist layer provided on a semiconductor substrate. A large number of ICs must be formed on the substrate. After an image of the mask has been formed on the substrate, this substrate is to this end displaced with respect to the mask by a distance which is slightly larger than the length or the width of the ICs to be formed, whereafter a subsequent mask image is made, and so forth. It is desirable that the illumination beam then has an intensity which is high as possible so that the illumination time for each IC is as short as possible and the time of passage of the substrate through the apparatus, i.e. the time required to illuminate all ICs is as short as possible. Consequently, a radiation source having a high radiation power must be used. Such a radiation source must be cooled because the greater part of the energy supplied to the radiation source is converted into heat. Moreover, the optical system within the illumination housing should be and should remain efficient for concentrating and further guiding the source radiation, i.e. it should collect as much radiation from the source as possible and absorb or deflect as little usable radiation as possible. For this reason also other optical components in the illumination housing, arranged in the path of the illumination beam, should preferably be cooled so as to prevent their degradation.

It has already been proposed in U.S. Pat. No. 5,166,530 to cool the radiation source with air from the ambience of the illumination housing, which air is passed through this housing for this purpose. However, it has been found that the power of the illumination beam then decreases relatively fast with time. In accordance with U.S. Pat. No. 5,166,530 this decrease is caused by the fact that the ambient air comprises volatile or gaseous particles such as hexamethyl disilazane (HMDS) coming from the adhesive layer on the substrate which ensures the adhesion of the photoresist layer, from which particles via photopolymerization silicon oxide is produced which precipitates on, for example the radiation-collecting reflector arranged behind the radiation source. According to U.S. Pat. No. 5,166,530, this $SiO_2$ layer has a high absorption coefficient for radiation at a wavelength of less than 365 nm. Since an illumination beam having an increasingly shorter wavelength is to be used for projecting images having increasingly smaller details on the substrate, the precipitation of $SiO_2$ within the illumination housing and on surface areas present in the path of the illumination beam is a serious problem.

To solve this problem, a carbon filter absorbing the volatile particles is arranged in the illumination unit disclosed in U.S. Pat. No. 5,166,530 in front of the inlet opening of the illumination housing. However, such a filter will be saturated in the course of time, which means that the particles are passed after some time in ever increasing quantities so that the power of the illumination beam decreases and the filter must eventually be replaced. A fresh carbon filter of good quality, used in optimal circumstances cannot purify the ambient air from the particles for 100%. In order that the period of time the air stays within this filter is sufficiently long, the carbon filter should be sufficiently thick so that this filter requires extra space. For a strong cooling of the radiation source a large quantity of air must be blown through the illumination housing, for example by means of a fan. However, the air then stays within this filter for a short period of time and the air is less well purified, for example for 60%. To achieve that the illumination housing contains only air which has passed through the filter, this housing should be airtight, which involves an extra complication for the housing.

It has been found that in the decrease of the power of the illumination beam not only $SiO_2$ but aim other compounds of silicon and oxygen such as $Si_3O_4$ and generally $Si_xO_y$ may play a role and that these compounds form a diffuse layer on, inter alia the radiation source reflector. Moreover, such a layer disturbs the specific reflector layer structure required for the reflection, so that the reflection wavelength band will be narrower. It has also been found that the HMDS particles may also decompose under the influence of radiation having a wavelength in the deep infrared range.

SUMMARY OF THE INVENTION

It is an object of the invention to provide an illumination unit with anticontamination means which does not have the above-mentioned drawbacks and yields an illumination beam having a high power which, apart from ageing of the radiation source, remains constant in time and in which use is made of the further insight gained into the cause of the silicon-containing deposit.

According to the invention, the illumination unit is characterized in that such means are present within the illumination housing and prevent a deposit from being formed from gas which has been introduced into the housing and has not been purified from decomposable particles.

Since the means preventing deposits are present within the illumination housing, it is not necessary to impose strict requirements on the sealing of this housing. These means do not exhibit any saturation or ageing phenomena so that the power of the illumination beam remains better constant in time. Moreover, the means are more efficient for the prevention of the deposit, as compared with a carbon filter arranged outside the illumination housing.

A first embodiment of the illumination unit, in which the illumination housing accommodates a concave reflector at the side of the radiation source remote from the radiation exit window, is characterized in that at least this reflector is provided with a passivating layer.

Such a layer ensures that the particles which could form an absorbing layer cannot adhere to the reflector so that these particles are depleted by the air stream,. A passivating layer may also be provided on other surface areas which are present in the path of the illumination beam within the illumination housing.

A second embodiment of the illumination unit is characterized in that the illumination housing is provided with a shower through which an oxygenless gas is blown along at least the surface area of a radiation source reflector.

The oxygenless, or inert gas constitutes a barrier layer between the reflector and the contaminated air, so that this air can no longer reach the reflector.

This gas is preferably nitrogen.

An embodiment of the illumination unit, utilizing a novel insight into the cause of an absorbing layer on optical components in the illumination housing, is characterized in that the radiation source is implemented in such a way that it does not emit ozone-forming radiation.

The lamps hitherto used in photolithographic apparatuses, such as mercury vapour lamps, or xenon lamps emitting radiation at a wavelength of 365 nm, which is called I-line radiation, also generate radiation at a wavelength in the deep UV range, for example, at 185 nm. This radiation converts oxygen present in the ambience of the lamp into ozone. The Applicant has found that the HMDS present in the ambience of the illumination housing and already mentioned in U.S. Pat. No. 5,166,530 reacts with oxygen radicals, i.e. oxygen molecules in which an electron is missing, with the product of this reaction precipitating on dielectric reflecting surface areas and forming a diffuse layer. The oxygen radicals are formed from the ozone by means of the radiation component having a wavelength of 254 nm present in the illumination beam. By using UV lamps which do not emit radiation at a wavelength in the deep ultraviolet range, smaller than 200 nm, the formation of ozone is prevented so that the reaction cannot take place.

Such lamps, which are also referred to as ozone-free lamps, are known per se for other applications, for example see U.S. Pat. No. 3,949,258.

The invention also relates to an apparatus for imaging a mask on a substrate, which apparatus comprises a mask holder, a projection lens system and a substrate holder, in that order. Such an apparatus according to the invention, having the advantage of a short illumination time, is characterized in that it comprises an illumination unit as described hereinbefore at the side of the mask holder remote from the projection lens.

BRIEF DESCRIPTION OF THE DRAWING FIGURES

These and other aspects of the invention will be apparent from and elucidated with reference to the embodiments described hereinafter.

In the drawings

DESCRIPTION OF THE INVENTION

Figure 1:
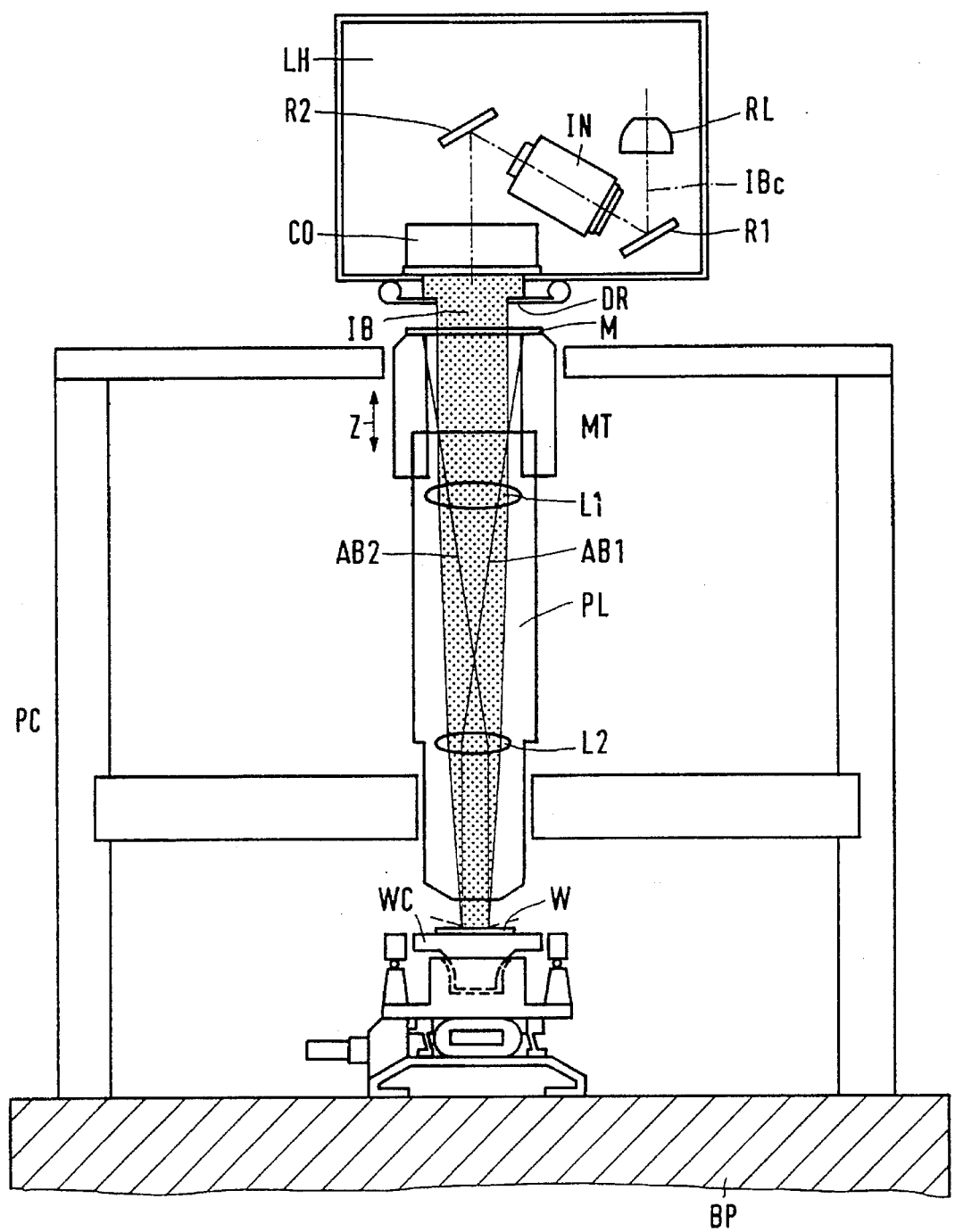
FIG. 1 shows an apparatus for imaging a mask on a substrate, in which apparatus the invention can be used.

FIG. 1 shows, very diagrammatically, an apparatus for repetitive imaging of a mask M on a substrate W.

Such an apparatus is described, inter alia in U.S. Pat. No. 5,100,237. This apparatus has an illumination housing LH supplying an actinic illumination beam IB. This beam passes a diaphragm DR and is subsequently incident on the mask M which is arranged on a mask table MT which is adjustable, for example in height, in the Z direction. The mask table MT forms part of a projection column PC incorporating also a projection lens system PL which comprises a plurality of lens elements, only two of which, $L_1$ and $L_2$, are shown in FIG. 1. The projection lens system images the mask M on the substrate W which is provided with a photoresist layer (not shown). The substrate is provided on a substrate support WC which forms part of a substrate table WT on, for example air bearings. The projection lens system has, for example a magnification $M=\frac{1}{5}$, a numerical aperture $NA>0.48$ and a diffraction-limited image field with a diameter of, for example 22 mm. The mask table MT is supported, for example by a granite base plate BP which closes the projection column at its lower side.

The substrate can be displaced in the X, Y and Z directions and rotated, for example about the Z axis with the aid of the substrate table. These displacements are controlled by various servosystems such as a focus servosystem, for example an, X, Y $\phi_z$ interferometer system cooperating with the substrate support, and an alignment system with which mask marks can be aligned with respect to substrate marks. Since these servosystems do not form pan of the present invention, they are not shown in the circuit diagram of FIG. 1. Only the alignment beams with their chief rays $AB_1$, $AB_2$ of the alignment system are shown. For further particulars of the projection apparatus reference is made to U.S. Pat. Nos. 5,100,237; 5,144,363 and 5,191,200 and European Patent Applications 0 467 445 and 0 498 499.

The mask must be imaged a number of times, in accordance with the number of ICs to be formed on the substrate, each time on a different area of the substrate. To this end a first substrate area is illuminated via the mask after the substrate has been arranged in the projection column and aligned with respect to the mask. Subsequently, the substrate is moved in the X or Y direction by a distance which is slightly larger than an IC area and a second area is illuminated. This process is repeated until all areas of the substrate have been illuminated.

In the manufacture of ICs it is important that the rate of passage of the substrate through the projection apparatus is as high as possible, i.e. the time necessary for illuminating the complete substrate is as short as possible. The time lapse required for illuminating an IC area should therefore be as short as possible. This time lapse is inversely proportional to the power of the illumination beam IB from the illumination housing LH. This housing accommodates a radiation source (not visible in FIG. 1) which is surrounded by, for example an, elliptical reflector RL, and further, for example an integrator IN which ensures a homogeneous distribution of radiation within the illumination beam IB of which, within the illumination housing, only the chief ray Ibc is shown, and possibly a condenser lens CO. Moreover, the housing may accommodate reflectors $R_1$, $R_2$ which fold the radiation path so that the dimensions of the illumination housing can remain limited.

Figure 2:
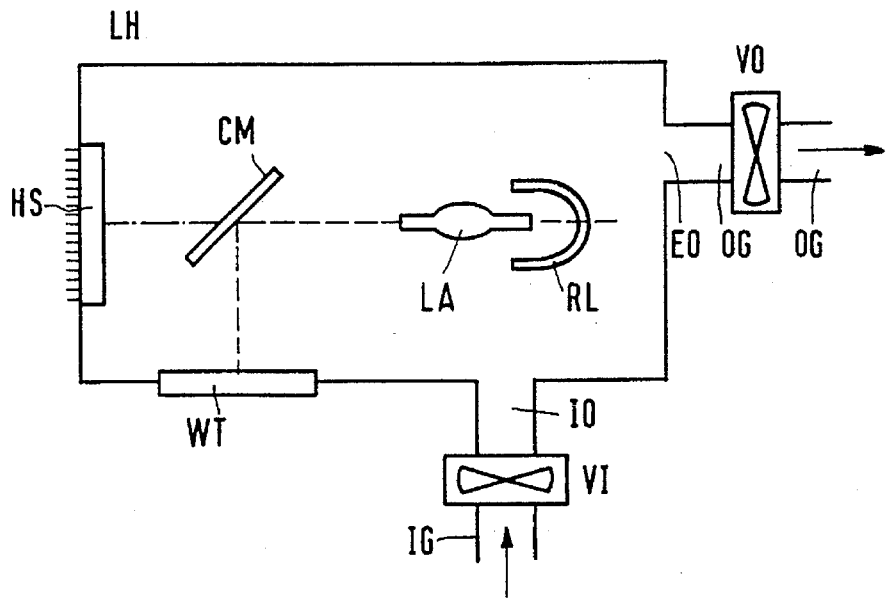
FIG. 2 shows an embodiment of an illumination housing for this apparatus.

In order that the illumination time per IC is as short as possible, the radiation source should supply a large power and this source should be cooled. As is shown in FIG. 2, the illumination housing is to this end provided with an inlet opening IO through which a cooling gas, for example ambient air, is introduced into the housing, and an exit opening EO through which this gas leaves the housing again. FIG. 2 shows an illumination housing in a cross-section and in a slightly different embodiment than in FIG. 1.

The illumination housing of FIG. 2 again comprises a radiation source LA, for example a high-pressure mercury vapour lamp, a reflector RL and a cold-light mirror CM which reflects only radiation of the desired wavelength to an exit window WT and passes the other radiation to, for example a heat-absorbing element HS. The supply lead IG for the cooling gas may incorporate a fan VI for forcibly passing this gas through. A similar fan VO may also be arranged in the gas exhaust lead OG.

Silicon-containing chemical elements, notably hexamethyl disilazane, abbreviated to HMDS and having the structural formula

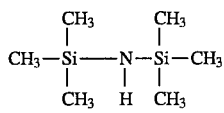

may enter the illumination housing. This is notably the case when the ambient air is used as a cooling gas.

This HMDS originates from the adhesive layer (primer) which is provided on the substrate W for the purpose of proper adhesion of the photoresist layer to the substrate. It has been found that this HMDS may form a diffuse layer on elements of the illumination housing, notably on the reflector RL when a known lamp is used which emits radiation at a wavelength of, for example, 365 rim. Such a lamp does not only emit radiation at the desired wavelength of 365 nm, but also radiation at a shorter wavelength, for example 185 nm. Under the influence of this radiation, oxygen $O_2$ present in the illumination housing is converted into ozone, $O_3$. This ozone is in turn converted into oxygen radicals $\dot{O}$ under the influence of radiation at a wavelength of 254 nm:

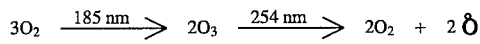

The oxygen radicals react with the HMDS which is cracked as follows

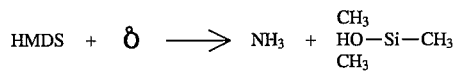

While the $CH_3$ groups are blown away or burned, the OH group preferably adheres to the metal oxides of the dielectric layers constituting the reflector RL, while a silicon-containing layer, for example an $SiO_2$ layer is formed on the reflector. Such a layer has an amorphous structure and is thus diffuse so that the reflector no longer reflects all incident radiation into the desired direction. Moreover, this layer disturbs the layer structure of the reflector so that its reflection coefficient decreases. Due to this effect, the power of the illumination beam may be reduced by, for example 30%. Consequently, the illumination time per IC area on the substrate would be increased by a proportional percentage, which is inadmissible in practice. Such layer may also be formed on other optical components within the illumination housing.

Using the newly gained insight that ozone plays a major part in the formation of the deposit on the reflector and other components, the present invention proposes as a first solution, which is the simplest solution as regards the construction of the apparatus, to use an ultraviolet lamp which does not emit radiation at a wavelength of less than 250 nm so that ozone is not formed any longer. To obtain such an ozone-free lamp, a lamp glass of such a composition may be chosen that it absorbs radiation at the unwanted wavelength. An ozone-free xenon lamp with an envelope is described in U.S. Pat. No. 3,949,258.

Figure 3:
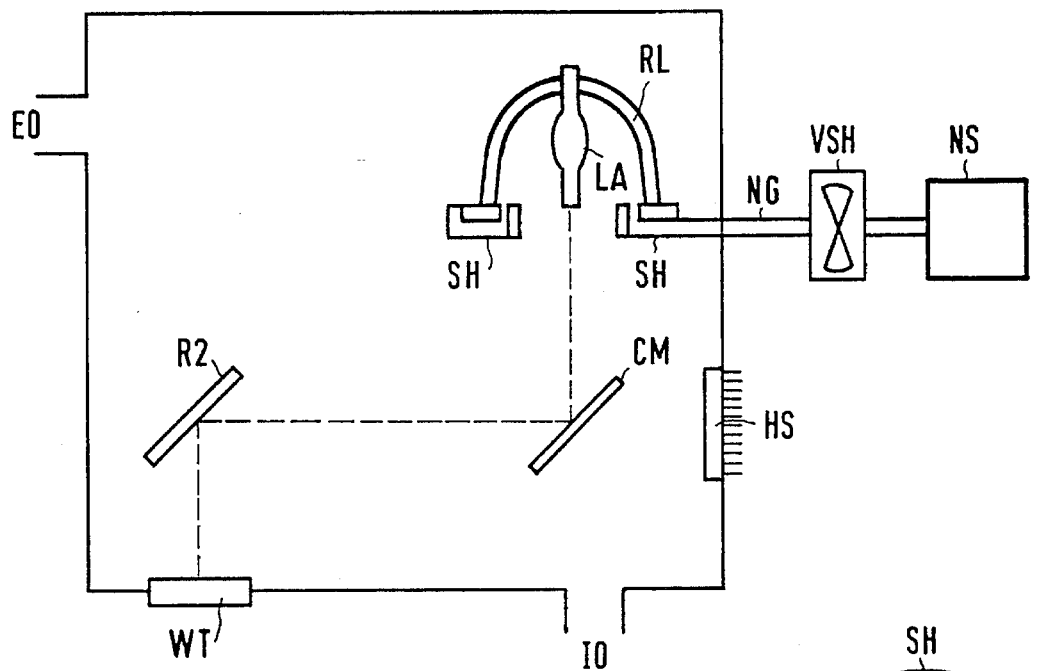
FIG. 3 shows a farther embodiment of the illumination housing according to the invention.
Figure 3:
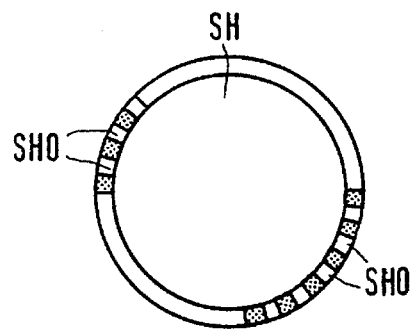

According to the invention, a second possibility of preventing the unwanted deposit on the optical components in the illumination housing is illustrated in FIG. 3. A shower SH with which nitrogen gas is sprayed along the reflector surface is now arranged at the lower side of the reflector RL. This gas is supplied from a supply vessel NS via, for example a pressure lead. The gas lead NG may also incorporate a fan VSH. The shower head has several dozen apemares SHO which have, for example a diameter of the order of several tenths of mm and sprays, for example, 4 liters/minute along the reflector. The stream of nitrogen should be laminar as much as possible. The nitrogen layer at the area of the reflector prevents silicon-containing particles from precipitating on the reflector surface. Such a nitrogen shower may also be arranged at other components which are situated in the path of the illumination beam and may be subject to contamination.

Figure 4:
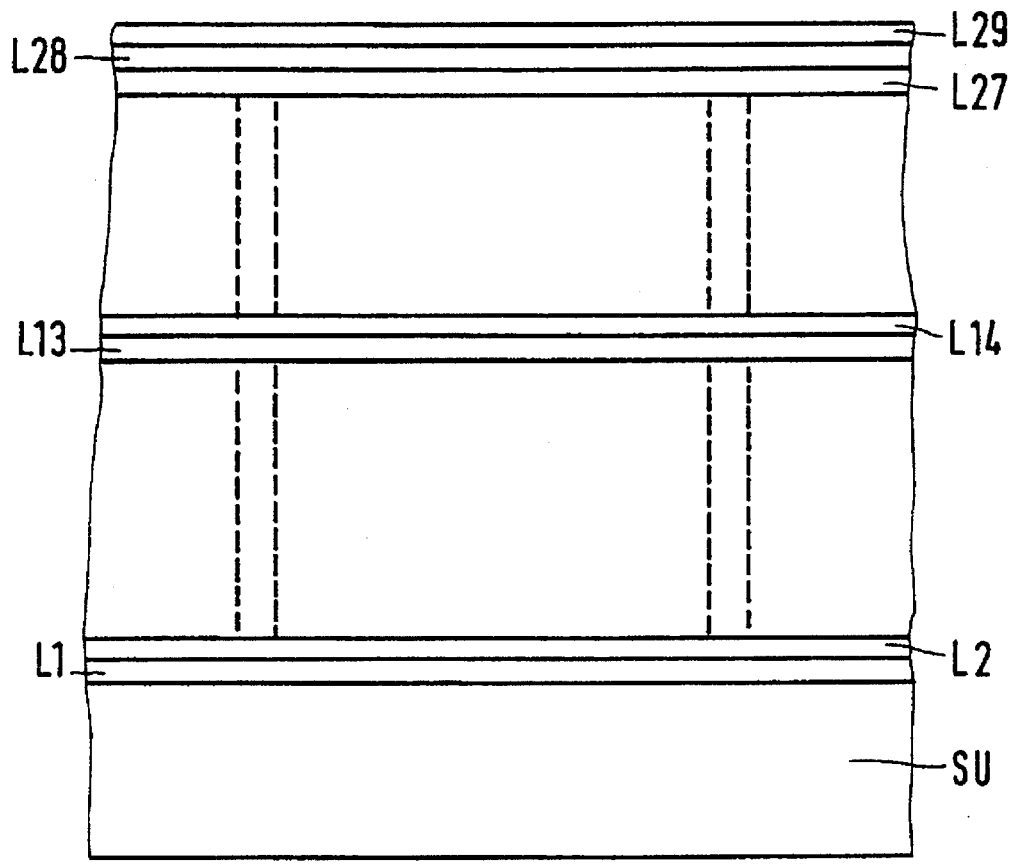
FIG. 4 shows a part of a reflector for an illumination housing according to the invention.

FIG. 4 shows diagrammatically and in a very enlarged form a small part of the mirror RL in a cross-section. A support SLI of, for example nickel is provided with a large number of layers, for example twenty-eight. The first thirteen layers $L_1 \ldots L_{13}$ are, for example alternately TiOx and SiOx layers and the layers $L_{14}$-$L_{28}$ are, for example alternately ZrTiOx and SiOx layers. Different layer sequences and materials, for example hafnium oxide (HfOx) are alternatively possible. The thickness of the layers of the stack varies between approximately 10 nm and 60 nm. Without the use of one of the measures according to the invention, a diffuse layer of SiOx would be formed on layer $L_{28}$ comprising ZrTiOx, so that the reflection coefficient of the reflector would decrease. According to the invention, a third possibility of inhibiting the occurrence of the unwanted layer to a considerable extent is to provide a passivating layer $L_{29}$. Such a transparent layer, having a thickness which is, for example an order of magnitude smaller than the wavelength of the illumination beam and comprises, for example, a fluorine-containing silane, ensures that silicon-containing particles cannot precipitate on the reflector surface where they would decompose.

A passivating layer may of course also be provided on lamp reflectors having a composition other than the one mentioned above, as well as on other critical components in the illumination housing such as the reflectors CM and $R_2$ in FIG. 3. The first-mentioned possibility according to the invention, viz. the use of ozone-free lamps of course also prevents unwanted deposits on components within the illumination housing other than the lamp reflector.

The fact that the invention has been explained with reference to an apparatus for repetitive imaging of a mask on a substrate does not mean that it is limited thereto. The apparatus may alternatively be of the "step-and-scan" type in which the mask pattern is scanned with a narrow beam during illumination of each IC area on the substrate so that a projection lens system having a smaller image field can be used. The invention may be further used in a lithographic projection apparatus in which the illumination beam has a different, short wavelength and consists of, for example g-line radiation having a wavelength of 436 nm. The photolithographic apparatus according to the invention may not only be used for forming IC structures, but also for the manufacture of liquid crystal display (LCD) panel structures. Finally, the invention may be used wherever an illumination with ultraviolet radiation must be realised in an ambience in which organic or inorganic compounds which may react with oxygen radicals occur.

We claim:

1. An illumination unit for illuminating an object with high efficiency in an ambience where particles are decomposed by influence of illumination radiation, said illumination unit comprising:

(a) an illumination housing, (b) a radiation source within said illumination housing, (c) an optical system for forming an illumination beam from radiation emitted by said radiation source, (d) first means for passing a gaseous cooling medium through said illumination housing to cool said radiation source, and (e) second means for preventing deposits of decomposable particles on surface areas within said illumination housing in the path of said illumination beam, said second means being within said illumination housing for preventing said deposits from being formed from gases introduced into said illumination housing, said gases not having been purified of decomposable particles.

2. An illumination unit as claimed in claim 1, in which the illumination housing accommodates a concave reflector at the side of the radiation source remote from a radiation exit window, characterized in that at least said concave reflector is provided with a passivating layer for eliminating unwanted deposits of material.

3. An illumination unit as claimed in claim 1, characterized in that the illumination housing is provided with third means for blowing a shower of an oxygenless gas along at least the surface area of a radiation source reflector.

4. An illumination unit as claimed in claim 3, characterized in that the gas is nitrogen.

5. An illumination unit as claimed in claim 1, characterized in that the radiation source is implemented in such a way that it does not emit ozone-forming radiation.

6. An apparatus for imaging a mask on a substrate comprising in sequence a mask holder, a projection lens system and a substrate holder, characterized in that an illumination unit as claimed in claim 1 is disposed remote from the projection lens system at a side of the mask holder.

* * * * *